United States Patent
Evirgen et al.

(10) Patent No.: US 12,224,369 B2
(45) Date of Patent: Feb. 11, 2025

(54) RADIATION DETECTOR AND ASSOCIATED MANUFACTURING METHOD

(71) Applicants: THALES, Courbevoie (FR); COMMISSARIAT A L'ENERGIE ATOMIQUE ET AUX ENERGIES ALTERNATIVES, Paris (FR)

(72) Inventors: Axel Evirgen, Palaiseau (FR); Jean-Luc Reverchon, Palaiseau (FR); Michel Garcia, Palaiseau (FR); Olivier Parillaud, Palaiseau (FR); Bruno Gerard, Palaiseau (FR)

(73) Assignees: THALES, Courbevoie (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 429 days.

(21) Appl. No.: 17/787,328

(22) PCT Filed: Dec. 17, 2020

(86) PCT No.: PCT/EP2020/086687
§ 371 (c)(1),
(2) Date: Jun. 19, 2022

(87) PCT Pub. No.: WO2021/122931
PCT Pub. Date: Jun. 24, 2021

(65) Prior Publication Data
US 2023/0016835 A1    Jan. 19, 2023

(30) Foreign Application Priority Data
Dec. 20, 2019 (FR) ..................... 1915024

(51) Int. Cl.
H01L 31/109 (2006.01)
H01L 31/0304 (2006.01)
H01L 31/18 (2006.01)

(52) U.S. Cl.
CPC ...... H01L 31/109 (2013.01); H01L 31/03046 (2013.01); H01L 31/1844 (2013.01)

(58) Field of Classification Search
None
See application file for complete search history.

(56) References Cited

U.S. PATENT DOCUMENTS 10,749,064 B2 * 8/2020 Evirgen ............... H01L 31/109
2012/0326122 A1 * 12/2012 Fujii ................. H01L 21/02463
257/14

(Continued)

FOREIGN PATENT DOCUMENTS

EP    1 642 345 B1    11/2008
EP    2 002 487 B1    10/2010

(Continued)

OTHER PUBLICATIONS

Mohammedy, et al., "Growth and fabrication issues of GaSb-based detectors", Journal of Materials Science: Materials in Electronics, vol. 20, No. 11, pp. 1039-1058, 2009.

Uzgur, et al., "Al/Sb free InGaAs unipolar barrier infrared detectors", Proceedings of SPIE, Infrared Technology and Applications XLIII, vol. 10177, p. 1017706-1-1017706-7, 2017.

*Primary Examiner* — Michelle Mandala
*Assistant Examiner* — Jordan M Klein
(74) *Attorney, Agent, or Firm* — BakerHostetler

(57) ABSTRACT

A radiation detector includes a stack of layers along a direction Z, the stack comprising: an absorbent layer, a first contact layer, an assembly consisting of at least one intermediate layer, referred to as an intermediate assembly, an upper layer, the first contact layer and the upper layer having a plurality of detection zones and separation zones, a detec- (Continued)

tion zone corresponding to a pixel of the detector, a passivation layer made from a dielectric material, arranged on the upper layer and having openings at the level of the detection zones of the upper layer, the semiconductor layers of the stack being compounds based on elements of groups IIIA and VA of the periodic table of the elements, the second material comprising the VA element antimony and the third material not comprising the VA element antimony.

14 Claims, 16 Drawing Sheets

(56) References Cited

U.S. PATENT DOCUMENTS

2018/0233619 A1  8/2018  Reverchon et al.
2019/0157338 A1  5/2019  Reverchon et al.

FOREIGN PATENT DOCUMENTS

| EP | 2 249 400 A2 | 11/2010 |
| EP | 2 797 122 A2 | 10/2014 |
| FR | 3 053 836 A1 | 1/2018 |

\* cited by examiner

RADIATION DETECTOR AND ASSOCIATED MANUFACTURING METHOD

CROSS-REFERENCE TO RELATED APPLICATIONS

This application is a National Stage of International patent application PCT/EP2020/086687, filed on Dec. 17, 2020, which claims priority to foreign French patent application No. FR 1915024, filed on Dec. 20, 2019, the disclosures of which are incorporated by reference in their entirety.

FIELD OF THE INVENTION

The present invention relates to the field of infrared (IR) imaging, and in particular to a radiation detector or photodetector manufactured with III-V materials and operating at a temperature higher than 80 K.

BACKGROUND

It is known that in order to obtain high-performance imagers in the field of IR detection, the detector must operate at cryogenic temperatures, which requires the installation of cryogenic circuitry consisting, inter alia, of a cryostat and a refrigerating machine.

One of the essential problems of these detectors is the increase in the operating temperature in order to satisfy requirements of compactness, reliability, reduction of consumption and manufacturing costs of the refrigerating machine and the cryostat. The aim is to reduce the size, weight and consumption power of the cryogenic circuitry installed around the detector (SWaP criteria, standing for "Size, Weight and Power"). An infrared imager consists of a matrix of photodetectors hybridized onto a silicon reading circuit.

The main physical quantity of the photodetector which is linked to its operating temperature is its dark current Id, that is to say the current present in the component in the absence of illumination. FIG. 1 presents the two mechanisms that limit the dark current Id of a photodetector to the bias voltage on a logarithmic scale and as a function of the inverse of the temperature T: the predominant phenomenon at low temperature is the generation-recombination current in the depletion zone, and the dominant phenomenon at higher temperature is the diffusion current in the flat bands. The two mechanisms cross over at a temperature Tc, defining two zones DIF and G-R. Above Tc (zone DIF), the dark current is limited by the diffusion mechanisms, and below Tc (zone G-R) by the generation-recombination mechanisms. The generation-recombination GR current originates from the generation of electron/hole pairs by means of SRH (Shockley-Read-Hall) defects in the gap in the zones having a field initially located at the junction between the absorbent layer and the contact. The diffusion current originates from the generation of electron/hole pairs by means of SRH defects and/or a third charge carrier (Auger effect 1 or 7) and/or the absorption of a photon (radiative effect linked to the thermodynamic equilibrium of the detector with its environment).

It is therefore desirable to produce a HOT (High Operating Temperature) imager operating at a temperature of more than 80 K, for which the IR detector is limited only by the diffusion current, regardless of the temperature range.

For example, in the MWIR [3.7 µm-5 µm], the majority of imagers currently marketed are made from InSb (III-V material) manufactured in implanted planar technology and operating at around 80 K, and therefore are not HOT imagers. In the MWIR [3.7 µm-4.1 µm], a HOT imager in "XBn" technology, which is described below, operates at 150 K. Documents EP1642345, EP2002487, EP2249400 and EP2797122 describe an example of a so-called "XBn" HOT photodetector having a reduced GR current. It is generally manufactured by molecular beam epitaxy (MBE) and consists of the following stack: X=contact of InAsSb, n or p doping, or GaSb, p doping/B=barrier of AlGaAsSb/n=absorbent zone of InAsSb. The barrier B has the highest gap.

This component differs from traditional PN homojunctions made from InSb material because its architecture makes it possible to confine the depletion zone, which is the source of a strong dark current, outside the "small-gap" materials such as InAsSb (absorbent zone) and in a larger-gap material AlGaAsSb (the barrier). InAsSb is then in a so-called "flat band" regime, referring to the energy bands of the minority carriers of the absorbent zone. Adjustment of the thickness and the doping of the barrier B, for a given contact, allows the absorbent layer to remain "flat-band". The small-gap material (absorbent zone) thus remains electric field-free, which allows the component to have a low dark current and to operate at 150 K. When the material X is GaSb, the structure has a higher "turn-on voltage" (bias voltage), which leads to extra consumption of the IR imager.

These components of the XBn type have a certain number of drawbacks:

The material AlGaAsSb (barrier) is difficult to control.

Growth and doping: aluminum-rich materials are known for being of inferior crystalline quality than materials based on indium or gallium (presence of numerous energy states in the gap). Furthermore, the optimum conditions for MBE growth of the layers of AlGaAsSb (barrier) and InAsSb (absorbent layer) are not the same, which means that compromises have to be made. AlGaAsSb doping is also difficult to control.

Technological process: AlGaAsSb oxidizes readily in contact with air or water, which makes the technological procedure more complex. Passivation and the stabilization of the AlGaAsSb surface after etching in order to obtain a "shallow MESA" is difficult to carry out and may be a source of inhomogeneity (risk of loss of adhesion of the dielectric on AlGaAsSb because of its oxidation, fluctuation of the oxide at the edge of the mesas that may lead to current fluctuations, electrical crosstalk, etc.).

The pixel formation is carried out by "shallow MESA" etching of the contact layer as far as the material AlGaAsSb, as illustrated in FIG. 2. A common electrode 2 is deposited on the substrate 6, followed by an absorbent layer 3 of InAsSb, a barrier layer 4 of AlGaAsSb, and a contact layer 110. The contact layer 110 (p doping) is etched in order to delimit the pixels and is connected to metal contacts 65.

Alignment of the offsets of the valence bands between InAsSb, AlGaAsSb and GaSb requires a bias voltage ("turn-on voltage") in order to be in a flat-band configuration. This configuration with a nonzero bias voltage may be a source of inhomogeneity, uncontrolled oxidation of the barrier being capable of generating a fluctuation of this characteristic voltage.

The structure XBn cannot operate correctly in a matrix arrangement with pixels whose doping is carried out by diffusion. This is because with X=InAsSb being a small gap, there would be a nonnegligible leakage current along the axis X of the pixel zones (p-doped) toward the interpixel zones (n-doped). With X=GaSb, it would be necessary to apply a higher bias voltage because of the alignment of the valence band offsets, which increases the consumption of the imager and is liable to cause numerous depolarization problems in the event of leaks, which is detrimental to the uniformity of the matrix.

In order to resolve some of these drawbacks, document FR 1601065 proposes an imager structure as illustrated in FIG. 3. This structure has the advantage of being compatible with pixel formation by diffusion, implantation or recessing (localized etching to make contact with a buried barrier layer), as described in document FR1501985.

The photodetector comprises a stack 201 of different materials, comprising a small-gap absorbent layer corresponding to the smallest gap of the entire structure, a charge screen layer C2, a transition layer C3, a window layer C4, and a dielectric passivation layer C7. The layers C1 and C2 have doping of a first type, preferably n, and the layer C4 comprises zones P1 doped with the second type p, delimiting the pixels, and n-doped interpixel zones P2.

Residual doping of a material is defined as doping inherent to its manufacture and/or to the chemical nature of the material produced (ex uncontrolled impurities), which may be ascertained by measurements. Intentional doping is obtained by incorporating dopant atoms into the material. The incorporation may be carried out during the growth or after the growth by implantation or diffusion of dopant atoms into the material.

The interpixel n doping in the zones P2 is adjusted during the growth, while the p doping of the zones P1 is carried out by post-growth insertion of p-dopant atoms into the layer C4.

A metallization 25 establishes the contact with the zone P1 (first electrode). In such a structure, the absorbent layer C1 remains flat-band by the management of the doping and the thickness of the charge screen layer C2.

The structure of the bands of the layers C1, C2, C3 and C4 is configured not to form a barrier to movement of the minority carriers (which are holes in the case of n doping of the absorbent layer) from the layer C1 to the layer C4. The holes flow in the valence band and the electrons flow in the conduction band. In the case of n doping of C1, the bands of interest are the valence bands.

The semiconductor materials of the stack are materials based on IIIA and VA compounds of the periodic table of the elements.

On the other side (lower side), the stack conventionally comprises an n-doped intermediate layer C6 and an n-doped substrate C5 for forming the n-contact (second electrode). Their band structure is configured not to present a barrier liable to oppose movement of the majority carriers (the electrons in the case of n doping of the absorbent layer) from C1 to the second electrode. In the case of n doping of C1, the bands of interest are the conduction bands.

An example of this structure is:

contact window layer C4 of GaSb (n doping)/transition layer C3 of GaSb (residual p doping)/charge screen layer C2 of InAlAsSb (n)/absorbent layer C1 of InAsSb (n).

The pixel formation is carried out by p-dopant diffusion or implantation into GaSb.

This type of structure has the following advantages:

no layer of AlGaAsSb (readily oxidizable and source of noise).

pixel formation by insertion of dopants, which allows simplified manufacture without "shallow MESA" etching and makes it possible to confine the minority charge carriers well in the interpixel, far from the dielectric C7/C4 interface.

no characteristic voltage for establishing the current. This structure operates in photovoltaic mode because the heterostructures GaSb/InAlAsSb and InAlAsSb/InAsSb are of type 2.

Nevertheless, this structure has drawbacks:

the surface to be passivated is GaSb. Antimony-based materials are known to be difficult to passivate. There are risks of leaks on the surface and electrical crosstalk at the level of the lateral GaSb PN junctions (along the axis X between pixel zones and interpixel zones).

the incorporation of dopants by insertion, preferably by diffusion, into GaSb is not obvious, in particular by metal organic vapor phase epitaxy MOVPE.

SUMMARY OF THE INVENTION

It is an object of the present invention to overcome the aforementioned drawbacks by providing a radiation detector in the spirit of the detector described above but having improved manufacture and operation.

The present invention relates to a radiation detector comprising a stack of layers along a direction Z, said stack comprising:

an absorbent layer configured to absorb the radiation and made from a first semiconductor material having a first gap and doping of a first type, a first contact layer made from a second material having a second gap strictly greater than the first gap, an assembly consisting of at least one intermediate layer, referred to as an intermediate assembly, arranged between the absorbent layer and the first contact layer, each intermediate layer being made from an intermediate semiconductor material having an intermediate gap greater than or equal to the first gap, an upper layer arranged on the first contact layer on the opposite side from said intermediate assembly, made from a third semiconductor material having a third gap strictly greater than all the other gaps of the stack, the first contact layer and the upper layer having a plurality of detection zones and separation zones, a separation zone separating one detection zone from another detection zone, each detection zone being surrounded by a separation zone in a plane perpendicular to Z, a detection zone corresponding to a pixel of said detector, the second and third materials being configured to have doping of a second type in the detection zones and doping of the first type in the separation zones, when the first doping type is n, a valence band of the first material is strictly less than a valence band of the second material in the detection zones, and the valence band or bands of the intermediate material or materials lie between the valence band of the first material and the valence band of the second material in the detection zones, and are configured to vary monotonically increasingly in the direction from the absorbent layer toward the first contact layer, when the first doping type is p, a conduction band of the first material is strictly greater than a conduction band of the second material in the detection zones, and the conduction band or bands of the intermediate material or materials lie between the conduction band of the first material and the conduction band of the second material in the detection zones, and are configured to vary monotonically decreasingly in the direction from the absorbent layer toward the first contact layer, a passivation layer made from a dielectric material, arranged on the upper layer and having openings at the level of the detection zones of the upper layer, the semiconductor layers of the stack being compounds based on elements of groups IIIA and VA of the periodic table of the elements, the second material comprising the VA element antimony and the third material not comprising the VA element antimony.

According to one embodiment: when the first doping type is n, the valence band(s) of the intermediate material or materials are less than the conduction band of the second material; when the first doping type is p, the conduction band(s) of the intermediate material or materials are greater than the valence band of the second material.

According to one embodiment: at the interface (12) between the upper layer and the contact layer in the detection zones: when the first doping type is n, the valence band of the third material lies below the valence band of the second material and the conduction band of the third material lies above the conduction band of the second material; when the first doping type is p, the conduction band of the third material lies above the conduction band of the second material and the valence band of the third material lies below the valence band of the second material.

According to one embodiment radiation detector as claimed in one of the preceding claims, wherein the third material is of the type III-As.

According to one embodiment, the second material is GaSb and the third material is InGaAs. Preferably, the percentage of indium of the third material is less than 50%.

According to one embodiment, the detector furthermore comprises:
a second contact layer arranged below the absorbent layer and on the opposite side from the intermediate layer, made from a fourth semiconductor material having
a fourth gap strictly greater than the first gap and doping of the first type, a substrate on which the second contact layer is deposited.

According to one variant, the doping of the second type of the detection zones is obtained by incorporation of dopant atoms into the contact layer and the upper layer, which is carried out after the growth of said contact layer and upper layer, and via said openings.

According to one embodiment, the upper layer and the first contact layer have, in the detection zones and over their entire respective thickness, a quantity of dopant atoms greater than $10^{17}$ atoms/cm$^3$.

According to another aspect, the invention relates to a method for producing a radiation detector, comprising:
a step of producing a stack of layers along a direction Z on a substrate, comprising:
an absorbent layer configured to absorb the radiation and made from a first semiconductor material having a first gap and doping of a first type,
a first contact layer made from a second material having a second gap strictly greater than the first gap,
a second contact layer made from a fourth semiconductor material having a fourth gap strictly greater than the first gap and doping of the first type, arranged between the substrate and the absorbent layer,
an assembly consisting of at least one intermediate layer, referred to as an intermediate assembly, arranged between the absorbent layer and the first contact layer, each intermediate layer being made from an intermediate semiconductor material having an intermediate gap greater than the first gap,
an upper layer arranged on the first contact layer on the opposite side from said intermediate assembly, made from a third semiconductor material having a third gap strictly greater than all the other gaps of the stack,
a passivation layer made from a dielectric material, arranged on the upper layer, the semiconductor layers of the stack being compounds based on elements of groups IIIA and VA of the periodic table of the elements, the second material comprising the VA element antimony and the third material not comprising the VA element antimony,
the second and third materials being configured to have doping of the first type,
a step of forming openings in the passivation layer,
a step of incorporating dopant atoms into the first contact layer and into the upper layer via the openings, so as to form detection zones having a second doping type, the detection zones being separated by separation zones separating one detection zone from another detection zone, each detection zone being surrounded by a separation zone in a plane perpendicular to Z, a detection zone corresponding to a pixel of said detector, the second and third materials then having doping of the second type in the detection zones and doping of the first type in the separation zones,
a step (400) of metallization through the openings (Op) in order to form a first electrode (E1).

According to one variant, the step of incorporating dopant atoms is carried out by diffusion.

According to one embodiment, the first doping type is n and the dopant atom incorporated is zinc.

According to one embodiment, the method according to the invention furthermore comprises, after the metallization step, a step of connecting a reading circuit to said stack via said first electrode.

According to one embodiment, the method furthermore comprises, after the step of producing the stack, a step of bonding a reading circuit to said stack, the step of forming the openings then being carried out through the reading circuit.

The following description presents several exemplary embodiments of the device of the invention: these examples do not limit the scope of the invention. These exemplary embodiments present both essential characteristics of the invention and additional characteristics linked to the embodiments considered.

BRIEF DESCRIPTION OF THE DRAWINGS

The invention will be understood more clearly, and other characteristics, aims and advantages thereof will emerge during the following detailed description with reference to the appended drawings, which are given by way of nonlimiting examples and in which:

FIG. 6a illustrates the band diagram in the pixel zone (Zdet) and FIG. 6b in the interpixel zone (Zsep).

FIG. 7a illustrates the band diagram in the pixel zone (Zdet) and FIG. 7b in the interpixel zone (Zsep).

FIG. 8a illustrates the band diagram in the pixel zone (Zdet) and FIG. 8b in the interpixel zone (Zsep).

DETAILED DESCRIPTION

Figure 1:
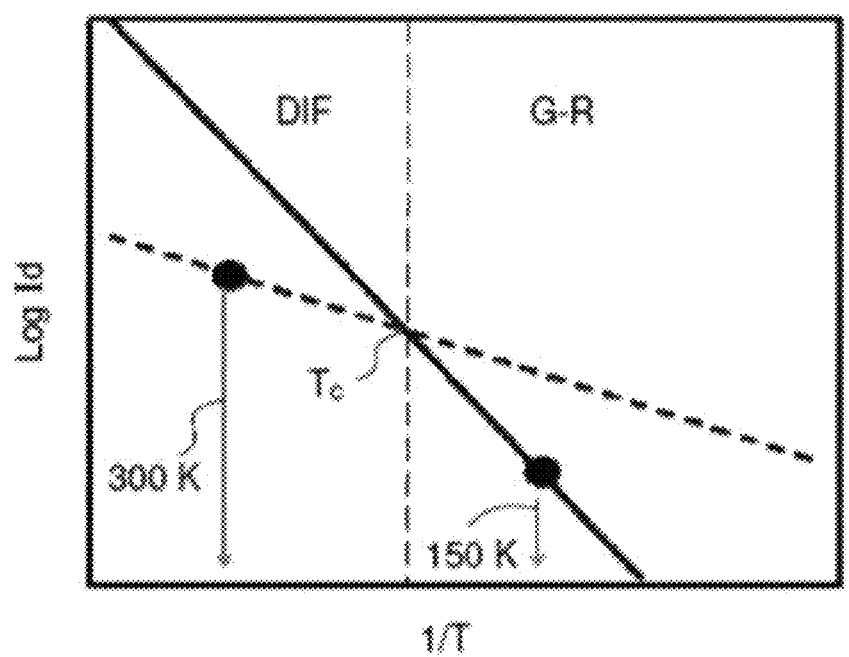
FIG. 1, already mentioned, illustrates the evolution of the dark current as a function of the temperature.
Figure 2:
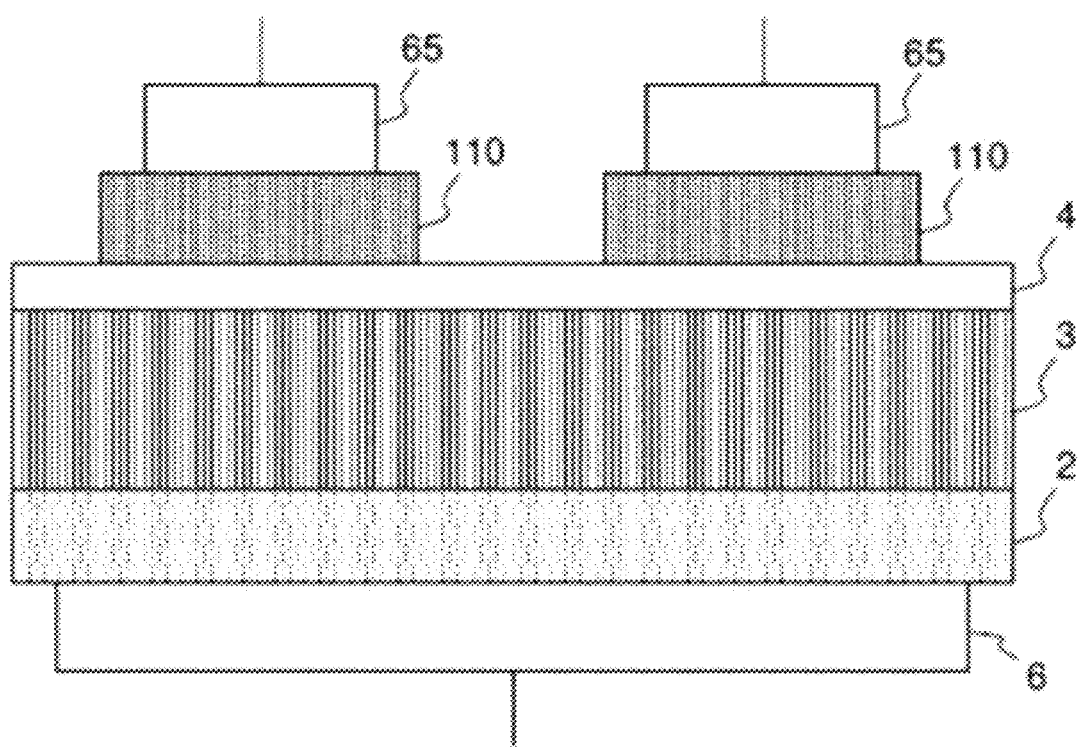
FIG. 2, already mentioned, illustrates the method of pixel formation by so-called "shallow MESA" etching.
Figure 3:
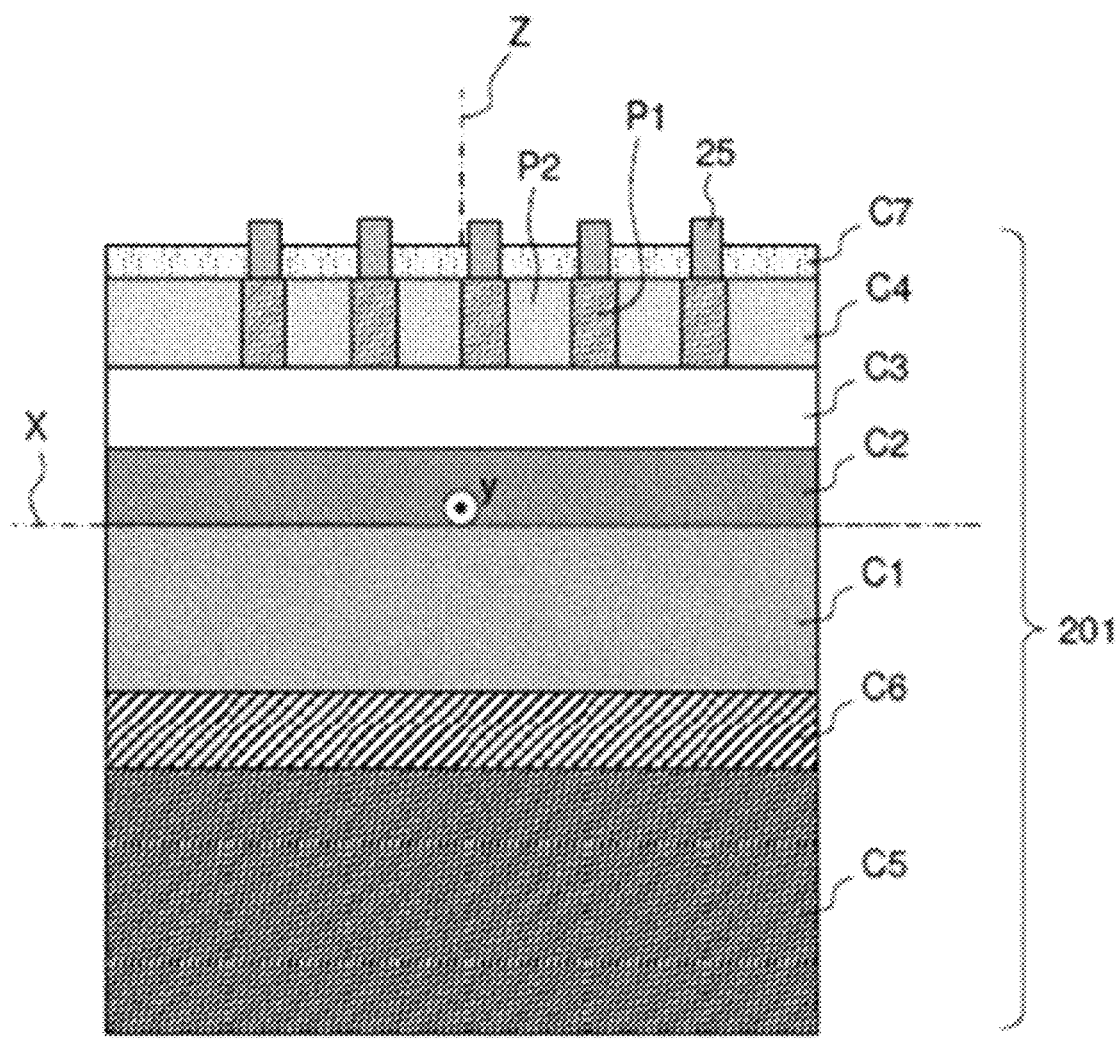
FIG. 3, already mentioned, illustrates a photodetector according to the prior art.
Figure 4:
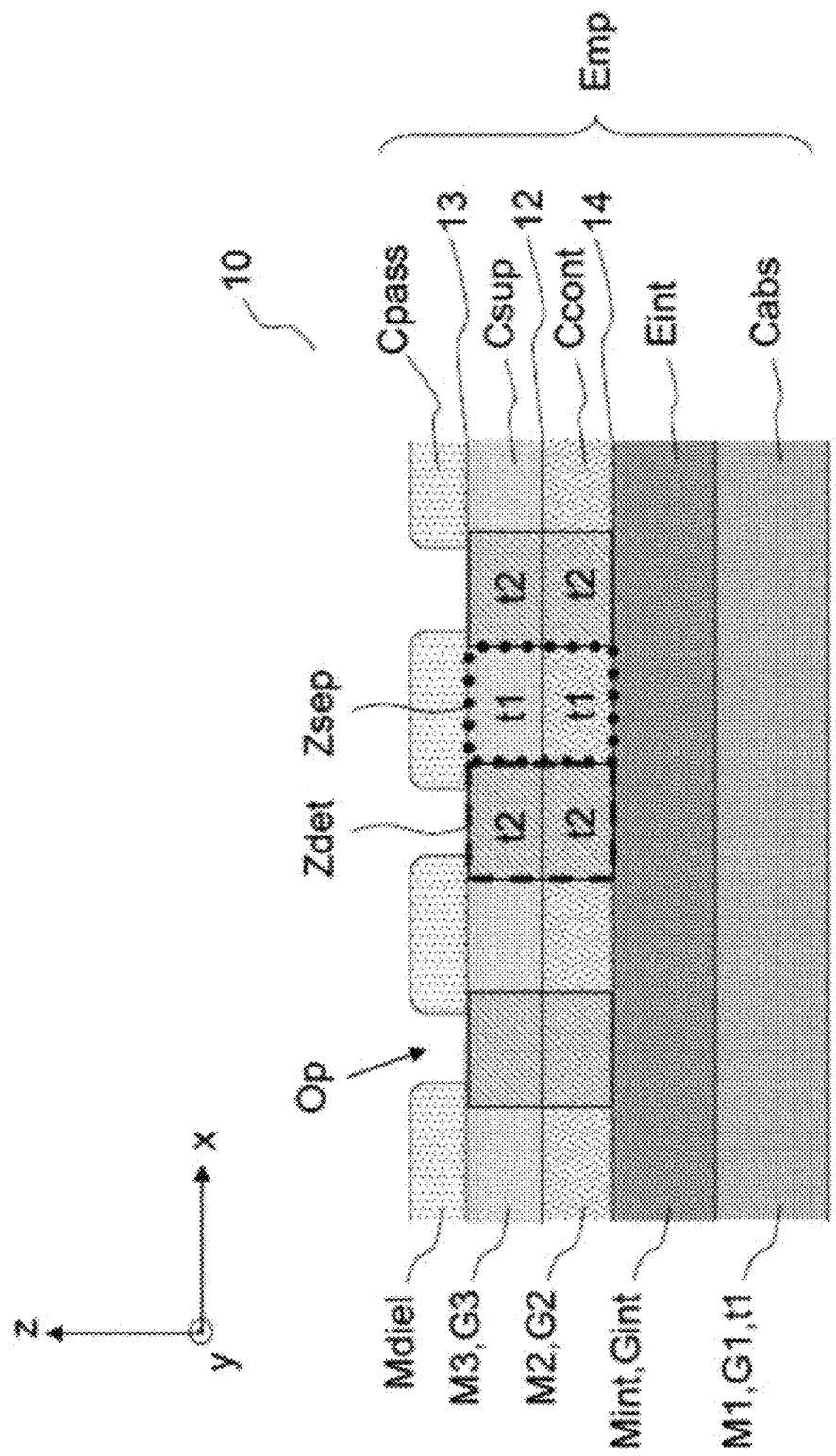
FIG. 4 illustrates the stack of a radiation detector according to the invention.

FIG. 4 illustrates a radiation detector 10 according to the invention, comprising a stack Emp of layers along a direction Z. The stack comprises a plurality of semiconductor layers and a dielectric layer. The semiconductor layers of the stack are components (binary, ternary, quaternary) based on elements of groups IIIA and VA of the periodic table of the elements. Group IIIA comprises: B, Al, Ga, In and group VA comprises: N, P, As, Sb, Bi.

The detector 10 comprises an absorbent layer Cabs which is configured to absorb the radiation, preferably IR radiation, preferably in the SWIR, MWIR or LWIR ranges, and is made from a first semiconductor material M1 having a first gap G1 and doping of a first type t1. The first doping type is n or p. Preferably but without limitation, the first doping type is n.

The doping (volume density of dopants) of M1 is typically fairly weak, of the order of $10^{14}$ to $5.10^{16}$ atoms/cm². The material M1 of Cabs is for example $In_XGa_{1-X}As_YSb_YBi_{1-Y-Z}$, $0 \leq X$, Y, $Z \leq 1$ or a superlattice (SL) $In_{X1}Ga_{1-X1}As_{Y1}Sb_{Y1}Bi_{1-Y1-Z1}/In_{X2}Ga_{1-X2}As^{Y2}Sb_{Y2}Bi_{1-Y2-Z2}$, $0 \leq X1, X2, Y1, Y2, Z1, Z2 \leq 1$.

The detector also comprises a first contact layer Ccont made from a second material M2 having a second gap G2 strictly greater than the first gap G1.

The material M2 of Ccont is preferably $Al_{X3}Ga^{1-X3}Sb_{Y3}As_{1-Y3}$ material. Preferably, $0 \leq X3 \leq 0.4$ and $0.96 \leq Y3 \leq 1$. The first contact layer Ccont always comprises the VA element antimony Sb in order to be close to a lattice match with the substrate on which the stack is produced, which is preferably GaSb (GaSb technology). Being close to a lattice match makes it possible to avoid dislocations, which degrade the material. Preferably, all the layers from the substrate to Ccont comprise antimony for the same reason. Preferably, the layer Ccont has a thickness of between 50 nm and 300 nm.

The stack also comprises an assembly consisting of at least one intermediate layer Cint, referred to as an intermediate assembly Eint, arranged between the absorbent layer Cabs and the first contact layer Ccont. Each intermediate layer indexed i, Cinti, is made from an intermediate semiconductor material Minti having an intermediate gap Ginti greater than or equal to the first gap G1: Ginti≥G1 for all i.

The index i varies from 1 to n, i=1 corresponding to the intermediate layer adjacent to the absorbent layer.

The purpose of the intermediate assembly Eint is to allow extraction and transport of the minority carriers from the absorbent layer Cabs toward the contact layer Ccont. Preferably, in order to obtain a low dark current in the absence of illumination, the thickness and the doping of the intermediate layer Cint1 in contact with the absorbent layer are determined in order to obtain the "flat-band" configuration.

The stack also comprises an upper layer Csup which is arranged on the first contact layer Ccont, on the opposite side from the intermediate assembly, and is made from a third semiconductor material M3 having a third gap G3 strictly greater than all the other gaps of the stack. The upper layer Csup does not comprise the VA element antimony Sb. The presence of this upper layer Csup not comprising antimony makes it possible to produce an optimized stack and a photodetector with improved operation, as explained below.

The first contact layer Ccont and the upper layer Csup have a plurality of detection zones Zdet and separation zones Zsep common to the two layers. A separation zone separates one detection zone from another detection zone, each detection zone being surrounded by a separation zone in a plane perpendicular to Z. A detection zone Zdet corresponds to a pixel of the detector. The materials M2 (of Ccont) and M3 (of Csup) are configured to have doping of the second type t2 in the detection zones and doping of the first type t1 in the separation zones.

When the first doping type is n, the second doping type is p, and vice versa.

In order to carry out extraction of the minority carriers in the pixels, conditions are necessary for the relative levels of the bands in which these carriers flow. When t1=n, the minority carriers are holes which flow in the valence bands, and when t1=p, the minority carriers are electrons which flow in the conduction bands.

Thus, when the first doping type is n, M2 needs to be configured in the detection zones so that the valence band of M1 is strictly less than the valence band of M2:

$BV$abs$<BV$cont (in Zdet)

It is also necessary that:

$BV$abs$<BV$int$(i)<BV$int$(i+1)<BV$cont (in Zdet), that is to say the valence band or bands BVinti of the intermediate material or materials Minti lie between the valence band BVabs of the first material and the valence band BVcont of the second material in the detection zones, and are configured to vary monotonically increasingly in the direction from the absorbent layer Cabs toward the first contact layer Ccont.

Likewise, when the first doping type is p, it is necessary that:

$BC$abs$>BC$cont (in Zdet)

It is also necessary that:

$BC$abs$>BC$int$(i)>BC$int$(i+1)>BC$cont, that is to say the conduction band or bands BCinti (also referred to as BCint(i)) of the intermediate material or materials lie between the conduction band BCabs of the first material and the conduction band BCcont of the second material, and are configured to vary monotonically decreasingly in the direction from the absorbent layer Cabs toward the first contact layer Ccont.

Figure 5:
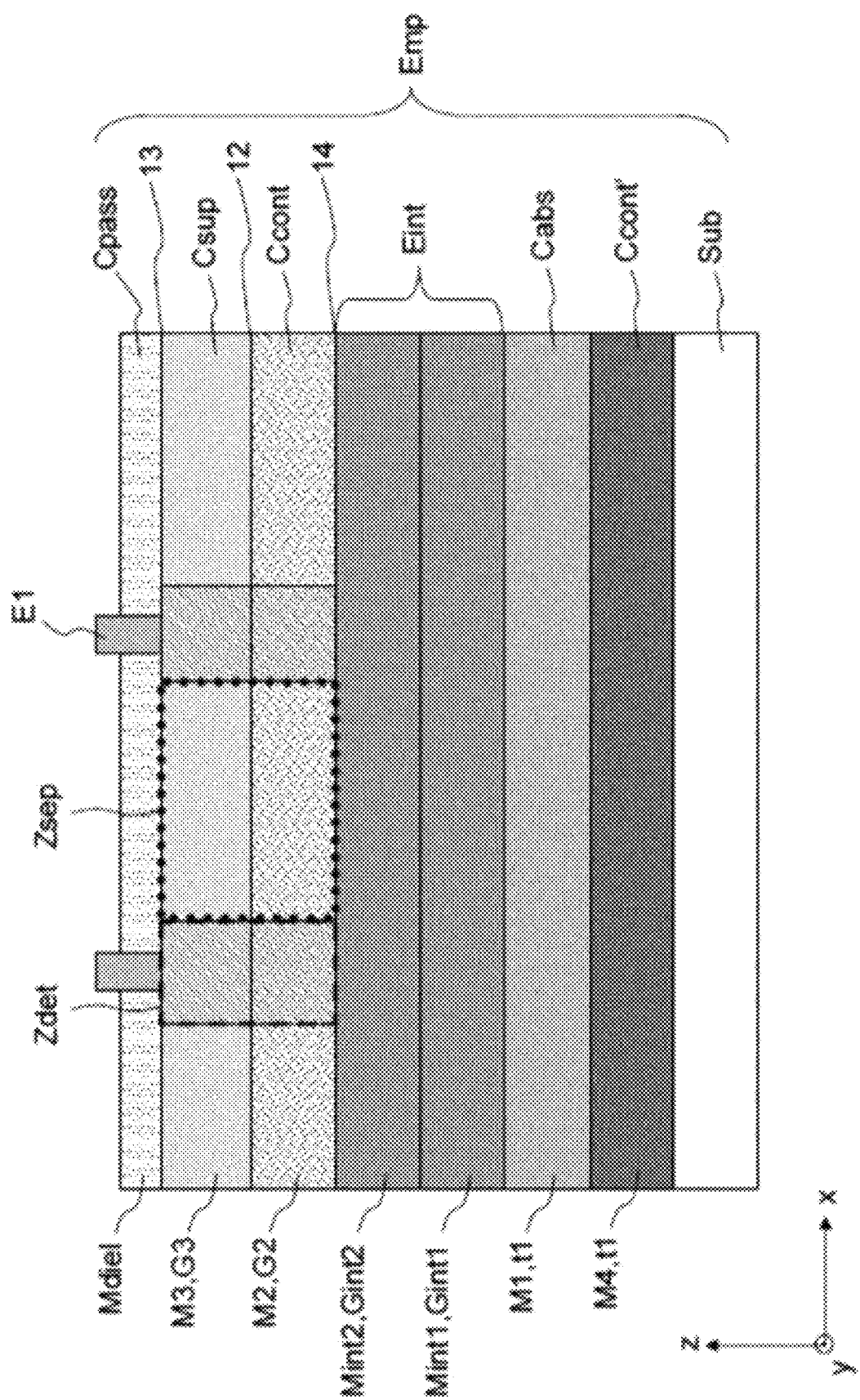
FIG. 5 illustrates a preferred variant of a stack of a radiation detector according to the invention.

The stack Emp also comprises a passivation layer Cpass made from a dielectric material Mdiel, arranged on the upper layer Csup and having openings Op at the level of the detection zones of the upper layer. A fraction of the detection zone of Csup is intended to be in electrical contact with a first electrode E1, the contact being carried out by metallization through openings Op, as illustrated in FIG. 5, which represents a variant of the stack of the detector once the electrode E1 has been produced.

12 denotes the interface between Ccont and Csup, 13 denotes the interface between Csup and Cpass, and 14 denotes the interface between the last intermediate layer and Ccont.

The function of Csup is to improve the passivation of the surface of the contact layer Ccont and the lateral junctions along X between the n-doped zones and the p-doped zones of the contact layer.

As explained above, the contact layer Ccont comprises antimony, the oxidation of which is difficult to control: antimony Sb oxidizes and picks up impurities. It is difficult to have a clean interface between the contact layer Ccont and a dielectric passivation layer.

The upper layer Csup does not comprise antimony, in order to avoid the drawbacks explained above. It is thus easier to passivate. Its large gap G3, the largest gap of the structure, furthermore makes it possible to reduce the influence of the lateral PN junctions (along X in FIGS. 4 and 5) between pixel zones (Zdet) and interpixel zones (Zsep) of M2 (Ccont). These junctions are located far from the interface 13 with the layer Cpass because of the presence of Csup.

Preferably, the thickness of Csup is less than or equal to 50 nm. This is because since Csup does not comprise Sb, it is not lattice-matched to the layer Ccont and therefore should not exceed a certain thickness.

Preferably, the third material M3 of the upper layer Csup is of the III-As type, that is to say it comprises, as the VA element, arsenic to the exclusion of any other element of this group. The production of the III-As layer benefits from the long-standing nature of the arsenide technology. Moreover, the diffusion of Zn dopants into this type of layer is well controlled and stable, and results in high doping levels.

An example of a pairing (M2 of Ccont, M3 of Csup) is:

$$M2=GaSb \text{ and } M3=InGaAs.$$

Preferably, the percentage of indium in Csup made from InGaAs is less than 50%, because with a higher percentage the gap is smaller.

Preferably, and conventionally, the stack Emp of the radiation detector according to the invention also comprises, as likewise illustrated in FIG. 5, a second contact layer Ccont' arranged under the absorbent layer and on the opposite side from the intermediate layer, and a substrate Sub on which the second contact layer is deposited. The substrate Sub and the contact layer Ccont' are transparent to the incident radiation.

The second contact layer Ccont' is made from a fourth semiconductor material M4 having a fourth gap G4 strictly greater than the first gap G1, and has doping of the first type t1 typically of more than $10^{17}$ atoms/cm$^3$. The second contact layer Ccont' is typically common to all the pixels and intended to be connected to a second electrode E2 (not represented).

Preferably, for doping t1=n, the valence band of Ccont' is less than the valence band of the absorbent layer, and/or the interface between Ccont' and Cabs is of type II. Preferably, the material M4 of Ccont' is $In_XGa_{1-X}As_YSb_YBi_{1-Y-Z}$, $0 \leq X, Y, Z \leq 1$.

Typically, the substrate Sub is made from GaSb and is doped with the first type (fewer dislocations) with doping of more than $10^{18}$ atoms/cm$^3$.

Figure 6:
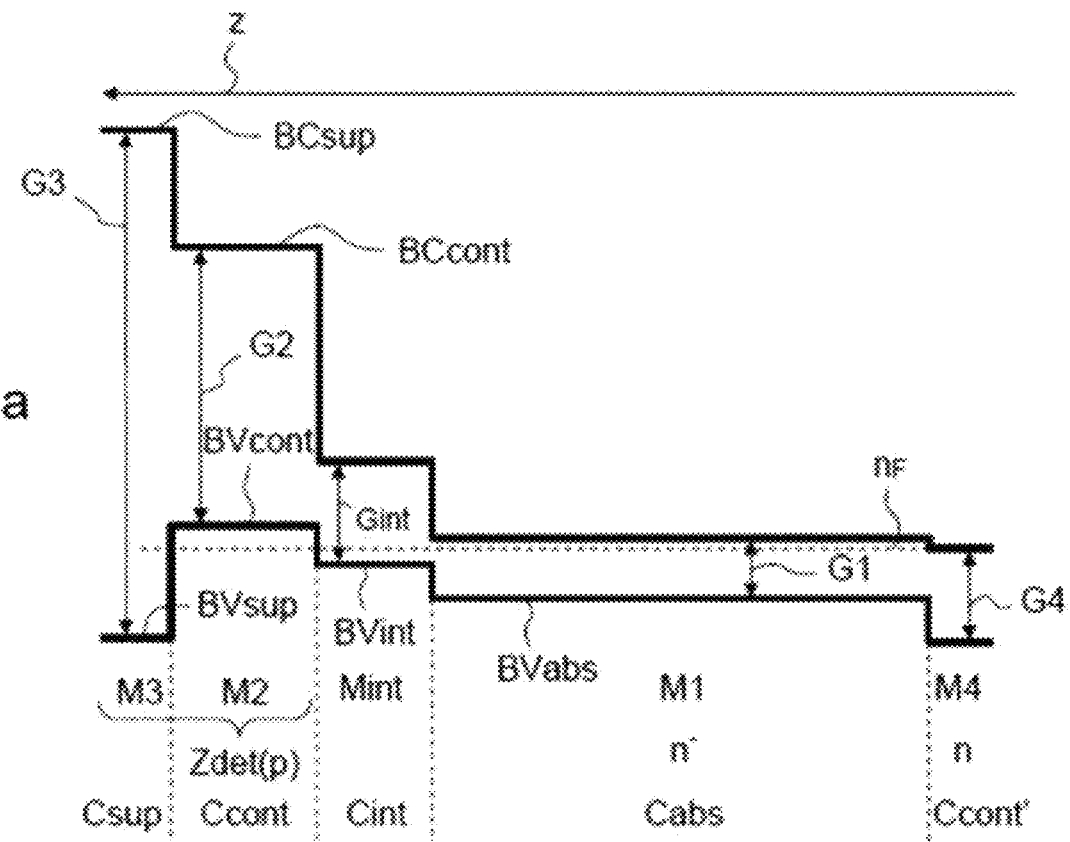
FIG. 6 illustrates the structure of the energy bands of a stack of a radiation detector according to the invention comprising a single intermediate layer.
Figure 6:
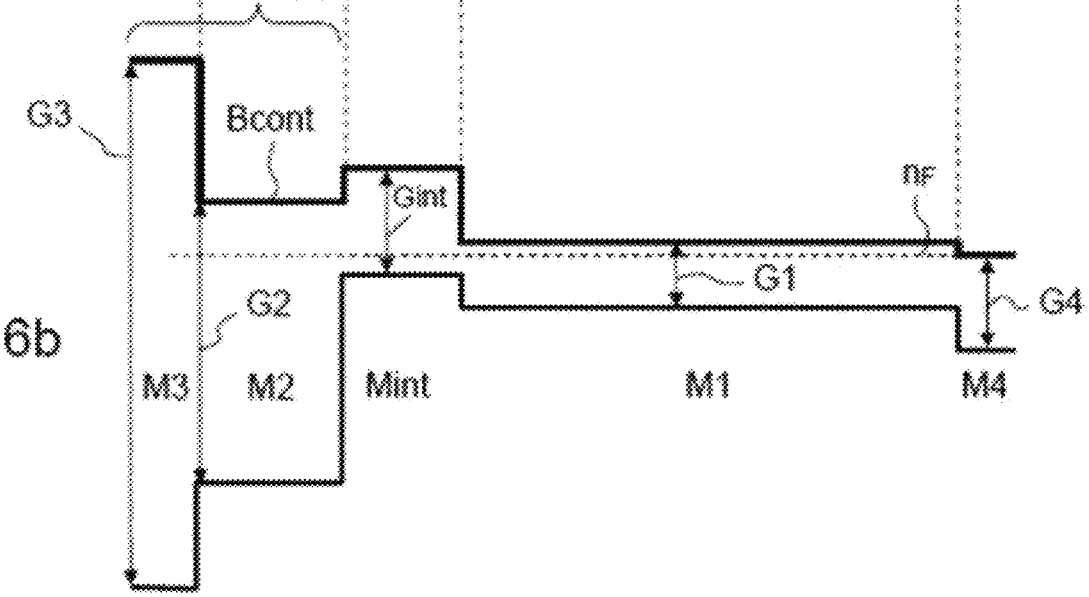
Figure 7:
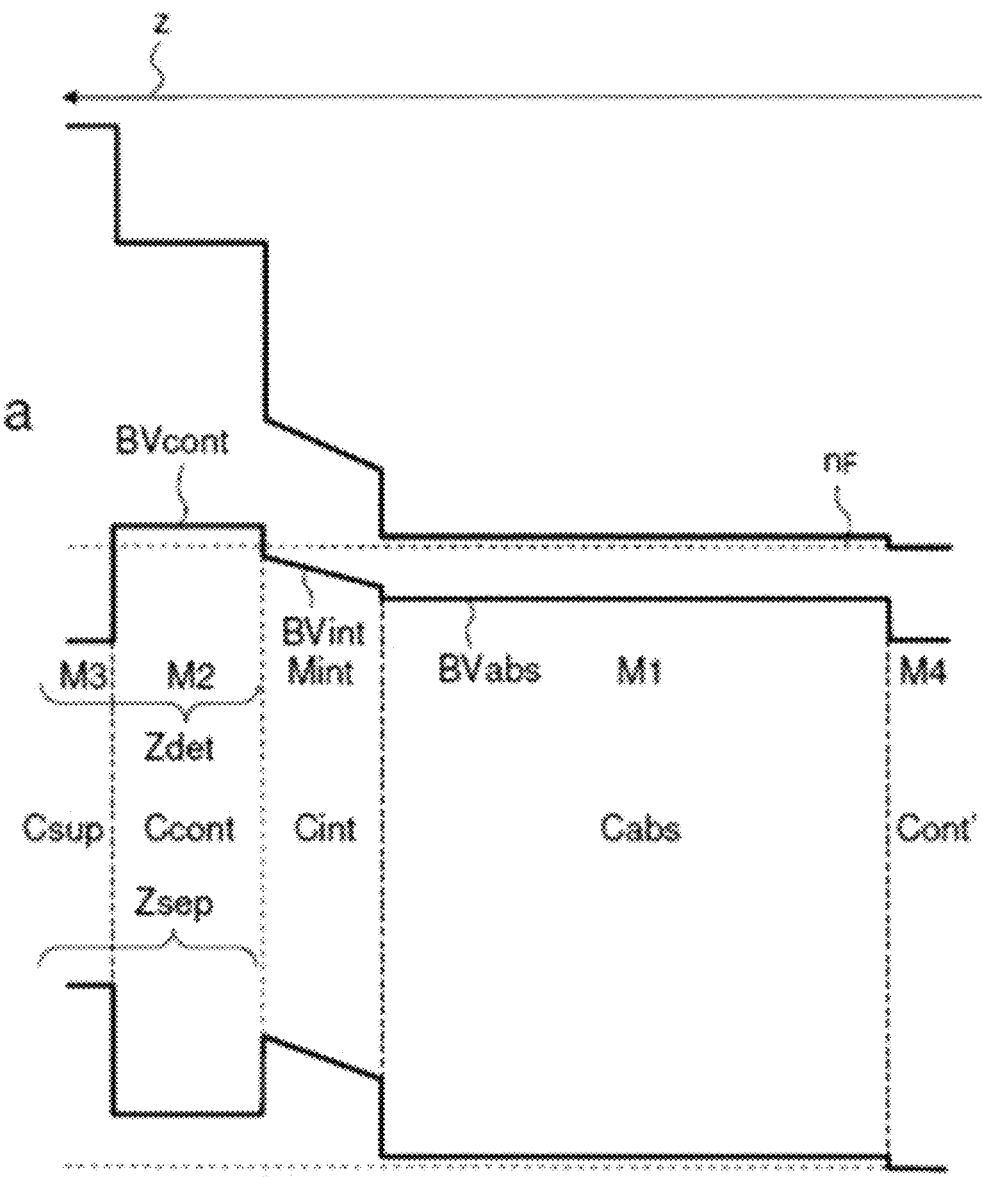
FIG. 7 illustrates the structure of the energy bands of a stack of a radiation detector according to the invention comprising an intermediate layer with a concentration gradient.
Figure 7:
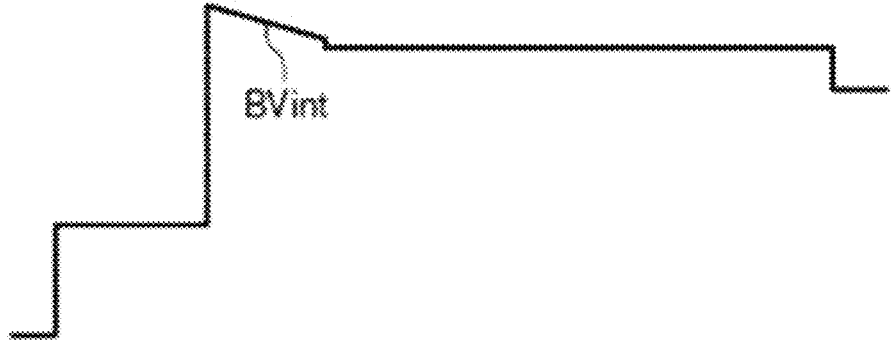
Figure 8:
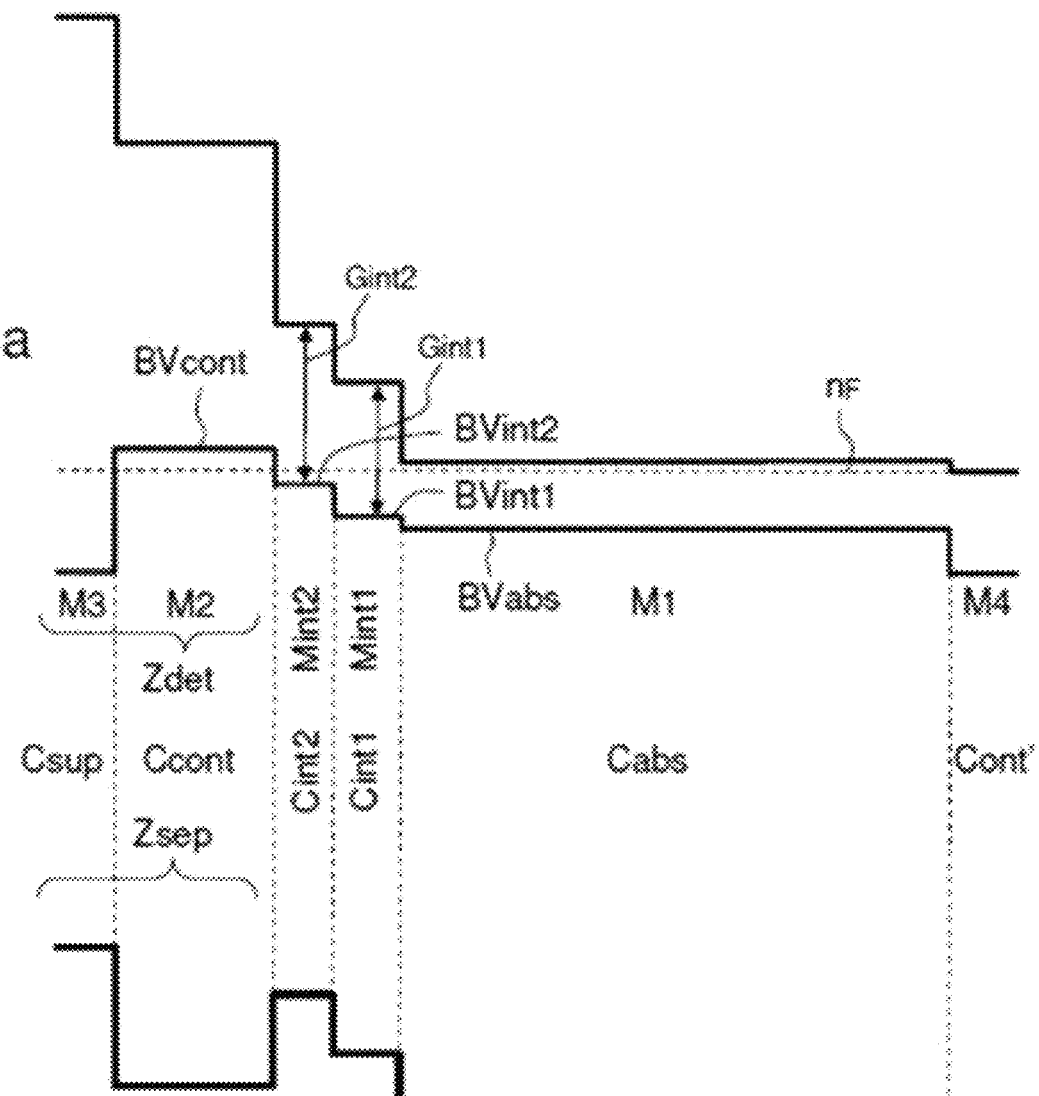
FIG. 8 illustrates the structure of the energy bands of a stack of a radiation detector according to the invention comprising two intermediate layers.
Figure 8:
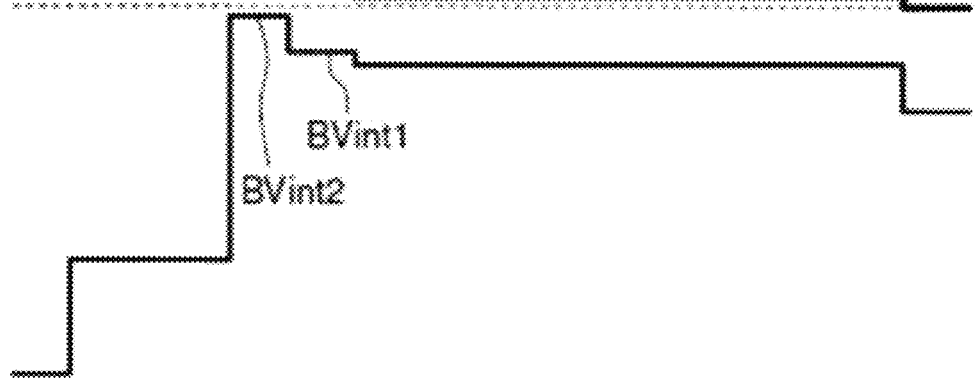

FIGS. 6 to 8 illustrate three examples of a schematic band structure (energy E in eV as a function of z along the axis Z) of the stack according to the invention for a first doping type n for the absorbent layer. FIGS. 6a, 7a and 8a illustrate the band structure of the stack for the zone Zdet of M2 and M3 (which are p-doped), and FIGS. 6b, 7b and 8b illustrate the band structure for the zone Zsep of M2 and M3 (which are n-doped). The doping, n or p, is shown clearly by the positioning of the Fermi level nF.

FIG. 6 illustrates the case of a single intermediate layer Cint.

FIG. 7 illustrates the case of an intermediate layer having a concentration gradient so as to vary the valence band continuously and increasingly.

FIG. 8 illustrates the case of two discrete intermediate layers Cint1 and Cint2.

An example of a pairing (Cint1, Cint2) is:
a layer Cint1 of material Mint1: $In_{x1}GaAs_{y1}Sb$,
a layer Cint2 of material Mint2: $InAl_{x2}As_{y2}Sb$,
with x1, x2, y1 and y2 determined so that in the p-doped zones Zdet:

$$BVabs < BvintX < Bvint2 < Bvcont$$

A combination of discrete intermediate layers and ones with a gradient is of course possible, so long as the condition of monotonic increase of the various values of the valence bands is satisfied.

It may be noted in FIGS. 6 to 8 that there is no valence band offset which could impede the transport of the minority carriers from M1 to M2. In the interpixel zones Zsep, the carriers remain well confined in the material M1 and not capable of approaching the interface 13 with the dielectric. Furthermore, the M2 pixel/M2 interpixel junctions are located far from this surface.

Preferably, for t1=n, the valence band or bands Bvinti (also referred to as Bvint(i)) of the intermediate material or materials are less than the conduction band Bccont of the first contact layer, in order to avoid an Esaki junction, this being the case in both zones Zdet and Zsep:

$$BVint(i) < BCcont$$

Likewise, for t1=p, the conduction band or bands BCinti of the intermediate material or materials are greater than the valence band BVcont of the first contact layer:

$$BCint(i) > BVcont$$

Preferably, at the interface 12 between the upper layer Csup and the contact layer Ccont:
when the first doping type is n, the valence band BVsup of the third material lies below the valence band BVcont of the second material and the conduction band BCsup of the third material lies above the conduction band BCcont of the second material (for both zones Zdet and Zsep),
when the first doping type is p, the conduction band BCsup of the third material M3 lies above the conduction band BCcont of the second material M2 and the valence band BVsup of the third material M3 lies below the valence band BVcont of the second material.

In other words, the interface Ccont/Csup is of type 1. It should be noted that this is indeed a condition at the interface between two semiconductor materials with different chemical formulae. Beyond the interface in the interior of each layer, however, the bands may evolve in such a way that the condition above is not satisfied (Fermi level associated with the doping).

This condition for the respective values of the bands of M2 and M3 makes it possible to prevent the electrons and holes of the contact layer Ccont from approaching the surface 13 in contact with the dielectric passivation layer Cpass, in order to avoid them recombining at this interface. This channel would drastically increase the dark current.

According to one preferred variant, the doping of the second type of the detection zones is obtained by incorporation of dopant atoms Ad into the contact layer and the upper layer, which is carried out after the growth of said contact layer Ccont and upper layer Csup, and via said openings Op.

Preferably, the doping of Ccont should remain more than $10^{17}$ cm$^{-3}$ throughout its thickness, and the levels of $10^{18}$ cm$^{-3}$ or $10^{19}$ cm$^{-3}$ are technologically readily accessible on the part of Ccont on the side of the supply of dopant atoms. Preferably, Ccont has a thickness of the order of 100 to 500 nm in order to support the diffusion of metal during the contact formation.

In this case, it is arranged that during the growth, the layers Ccont and Csup have doping (residual or intentional) of the first type, which therefore corresponds to the doping of the separation zones.

According to one preferred embodiment, the incorporation of Ad is carried out by diffusion. As an alternative, it is carried out by ion implantation.

For the case of incorporation by diffusion, the layer Csup has a second functionality, that of promoting the incorporation of dopant atoms into the layer Ccont. The upper layer is then referred to as a "pumping layer".

For this purpose, the atom Ad should be sufficiently soluble in the layer Csup. Preferably, this solubility is at least equal to $10^{18}$ dopant atoms per cm$^3$.

During incorporation by diffusion of dopant atoms, there is a reduction of the number of dopant atoms as a function of the layer thickness crossed.

Preferably, the upper layer Csup and the first contact layer Ccont have in the detection zones, and over their entire respective thickness, a quantity of dopant atoms Ad greater than or equal to $10^{17}$ atoms/cm$^3$, so as to compensate for the initial doping of the first type over the entire thickness of Ccont and to obtain doping of the second type in the detection zones by diffusion.

Preferably, Csup and a part of Ccont on the side of Csup (arrival side of the dopant atoms) have, in the detection zones, a quantity of dopant atoms Ad greater than $10^{19}$ atoms/cm$^3$, preferably greater than $10^{20}$ atoms/cm$^3$.

When t1=n and t2=p, the p doping of the detection zones is preferably obtained by incorporation of zinc atoms. For example, zinc has a good solubility in GaSb, typically more than $10^{20}$ atoms/cm$^3$.

When t1=p and t2=n, according to one option, then doping of the detection zones is obtained by incorporation of tellurium or germanium atoms, for Ccont made from GaSb and Csup made from III-As.

Figure 9:
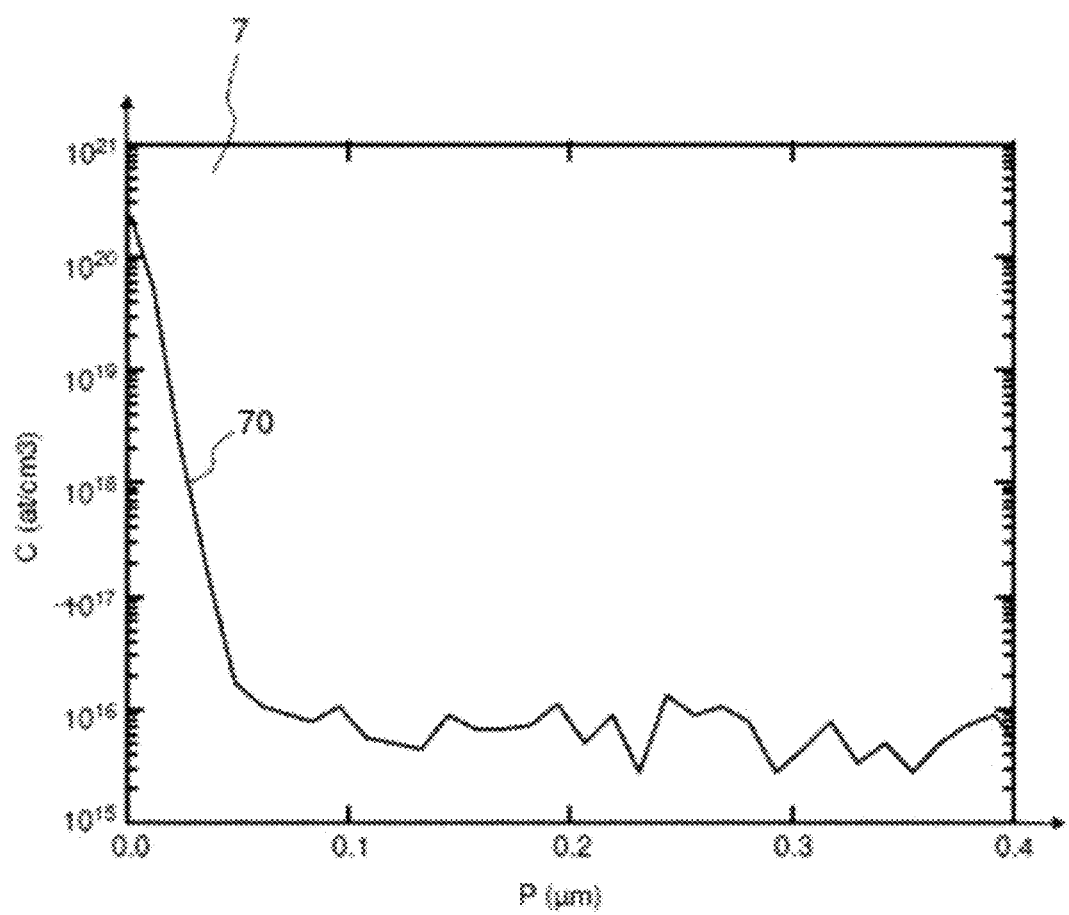
FIG. 9 illustrates the concentration of Zn atoms incorporated by diffusion into a layer of GaSb.
Figure 10:
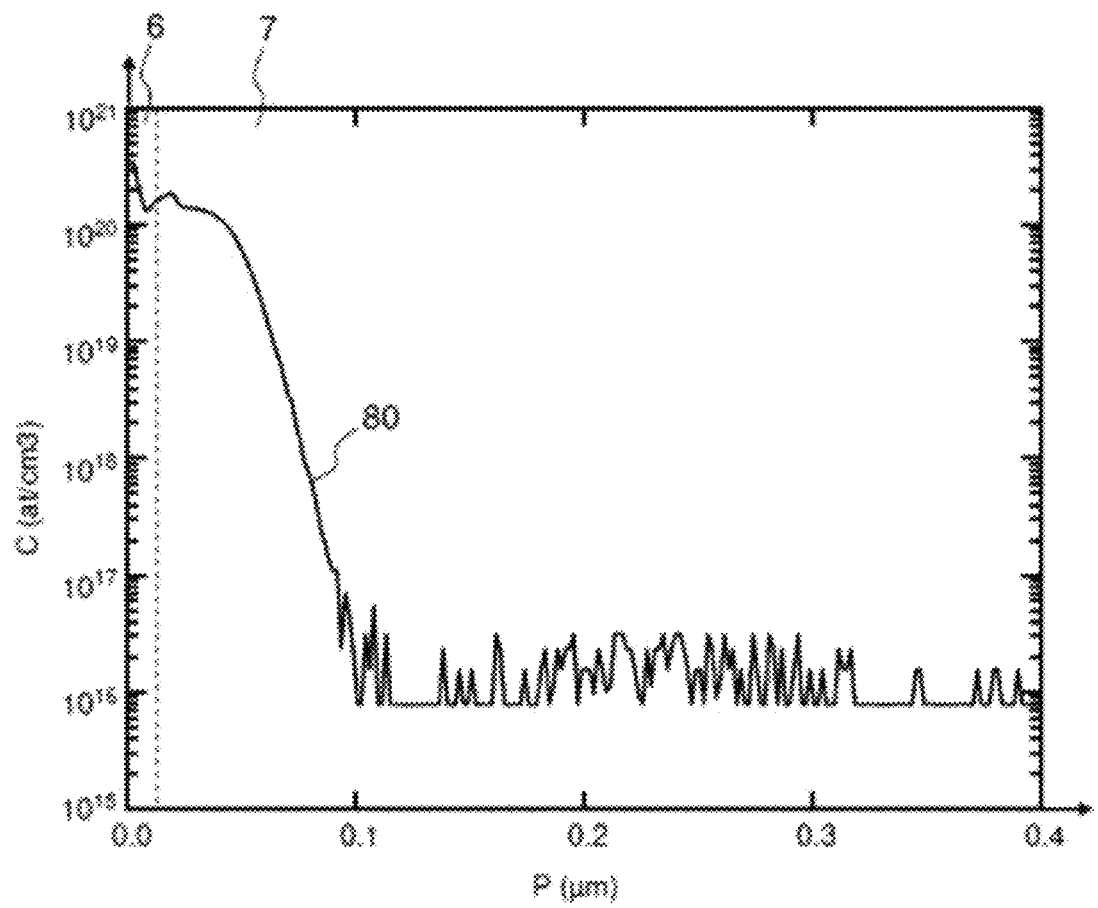
FIG. 10 illustrates the concentration of Zn atoms incorporated by diffusion into a layer of GaSb preceded by a surface layer of InAsSb.

In order to illustrate the aforementioned pumping function of Csup, FIGS. 9 and 10 respectively illustrate the concentration C of zinc dopant atoms as a function of the depth P in the material during diffusion of Zn by MOVPE into a layer 7 of GaSb alone (curve 70, FIG. 9) and preceded by a 10 nm surface layer 6 of InGaAs (curve 80, FIG. 10), (measured by Secondary Ion Mass Spectroscopy, SIMS). By comparing the two curves 70 and 80, it may be seen that the front edge is more homogeneous and the level of doping is higher in the layer 7 of GaSb than when the diffusion is carried out in the presence of the layer of InGaAs.

The purpose of the upper layer Csup according to the invention is thus to promote the diffusion into the layer Ccont by pumping the dopant atoms, while having a larger gap than the contact layer Ccont, which is typically made from GaSb. One example is a layer Csup of a few tens of nanometers of ternary $In_xGa_{(1-x)}As$ with x such that the gap of this layer is greater than the gap of GaSb. Since the substrate is preferably made from GaSb, this material InGaAs is in a lattice mismatch and should therefore have a sufficiently small thickness.

Figure 11:
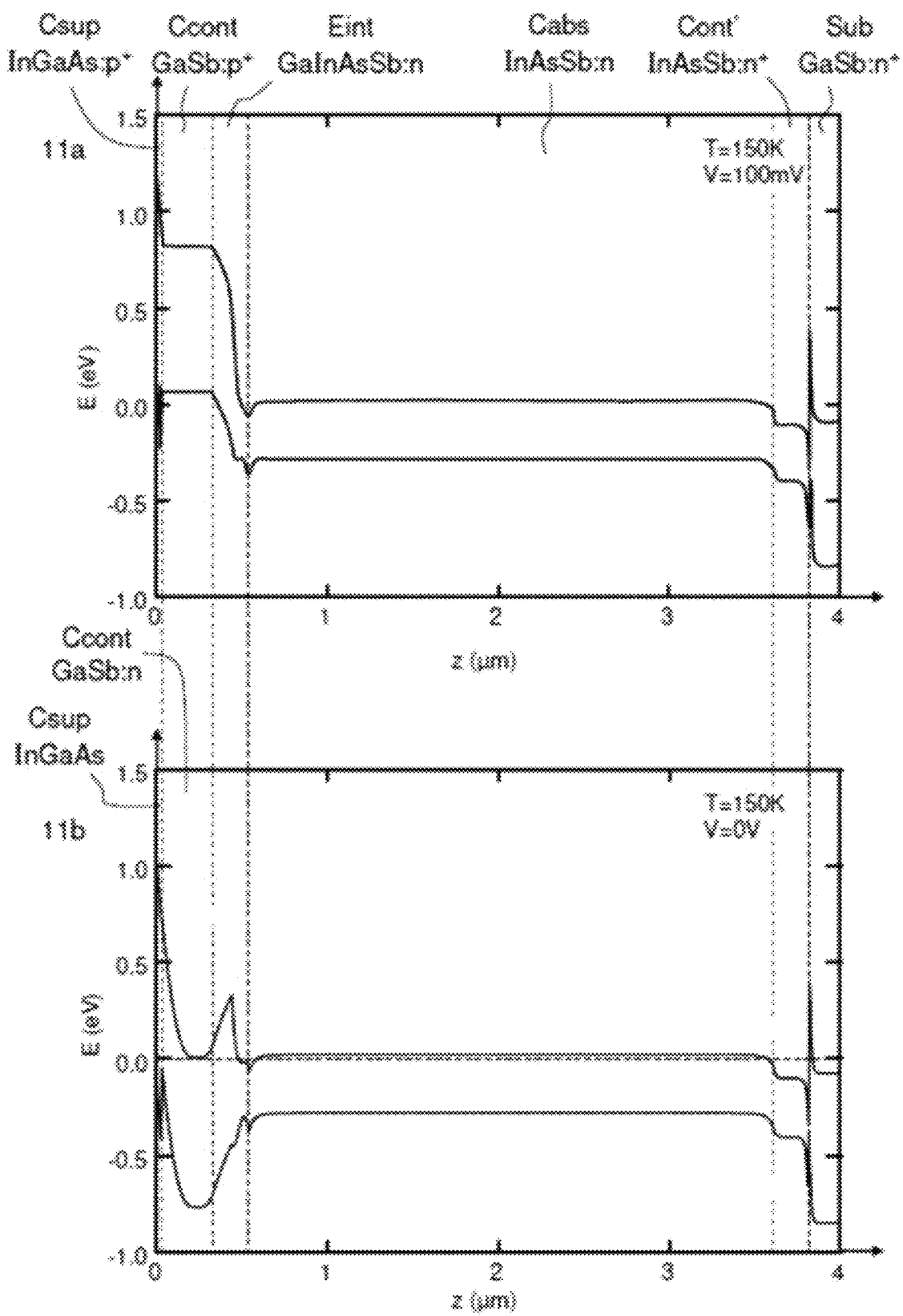
FIG. 11 illustrates the simulated band diagram of an example of a stack of a detector according to the invention.

A simulation of the band structure of an example of a stack according to the invention is illustrated in FIG. 11.

FIG. 11a illustrates a pixel zone (Zdet) and FIG. 11b illustrates an interpixel zone (Zsep):

The layer Cabs is made from n-doped InAsSb, the layer Ccont' is made from n$^+$-doped InAsSb, the substrate is made from n$^+$-doped GaSb, and the intermediate assembly consists of a layer of n-doped GaInAsSb in which a gradient of the valence bands in the pixel zone is obtained by varying the chemical composition of the different atoms. In the pixel zone, the layer Ccont is made from p$^+$-doped GaSb and the layer Csup is made from p$^+$-doped InGaAs. In the interpixel zone, the layer Ccont is made from n-doped GaSb (intentional doping) and the layer Csup is made from InGaAs. p or n doping typically corresponds to doping of up to $10^{17}$ cm$^{-3}$, and p+ or n+ to doping beyond $10^{17}$ cm$^{-3}$.

Figure 12:
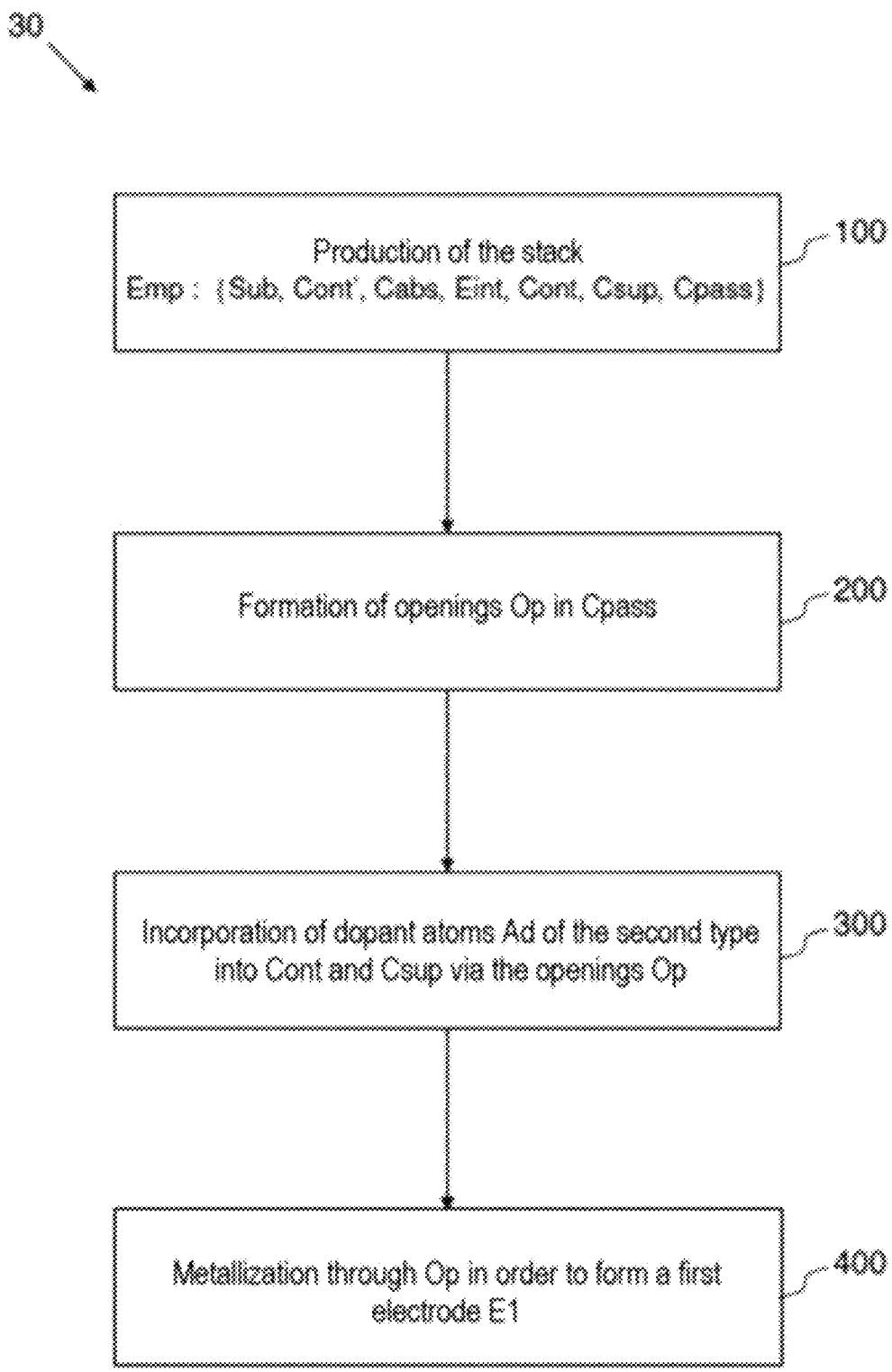
FIG. 12 illustrates the method for producing a radiation detector according to another aspect of the invention.

According to another aspect, the invention relates to a method 30 for producing a radiation detector, as illustrated in FIG. 12, comprising a first step 100 of producing a stack Emp of layers along a direction Z on a substrate Sub, such as have been described above. The stack Emp therefore comprises: Sub/Ccont'/Cabs/Eint/Ccont/Cpass During the production of the layers Ccont and Csup, that is to say during the growth, the materials M2 and M3 are configured to have doping of the first type. This doping may be residual or intentional.

The semiconductor layers of the stack Emp (that is to say all the layers except for Cpass) are typically produced by molecular beam epitaxy (MBE) or MOVPE.

The method 30 also comprises a step 200 of forming openings Op in the passivation layer Cpass by reactive ion etching (RIE) or using an inductively coupled plasma (ICP).

It also comprises a step 300 of incorporating dopant atoms Ad into the first contact layer Ccont and into the upper layer Csup via the openings Op, so as to form the detection zones Zdet having a second doping type. The materials M2, M3 then have doping of the second type in the detection zones Zdet and doping of the first type in the separation zones, into which the atoms Ad have not been incorporated.

Finally, the method 30 comprises a step 400 of metallization through the openings Op in order to form a first electrode E1.

Preferably, the step 300 of incorporating dopant atoms is carried out by diffusion. The presence of the layer Csup allows a greater quantity of dopant atoms to be made to enter the layer Ccont. According to one option, the diffusion is carried out using a sealed ampoule, and according to another option by MOVPE under a flow of pure nitrogen or hydrogen (supply of the V element and the dopant atom).

As an alternative, the step 300 is carried out by ion implantation.

Preferably, the first doping type is n and the dopant atom incorporated is zinc.

Figure 13:
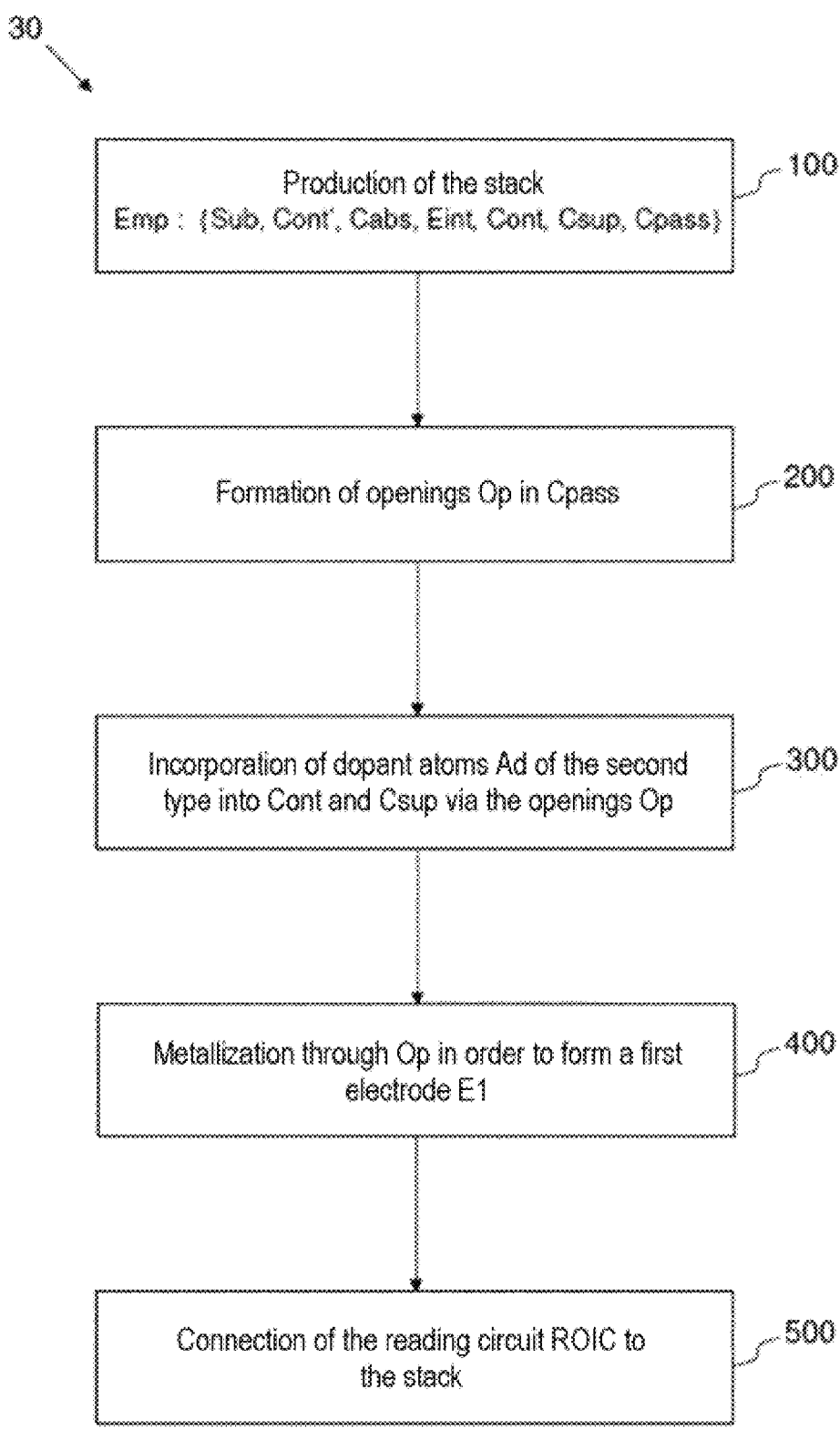
FIG. 13 illustrates a first variant of the method for producing a radiation detector according to the invention.
Figure 14:
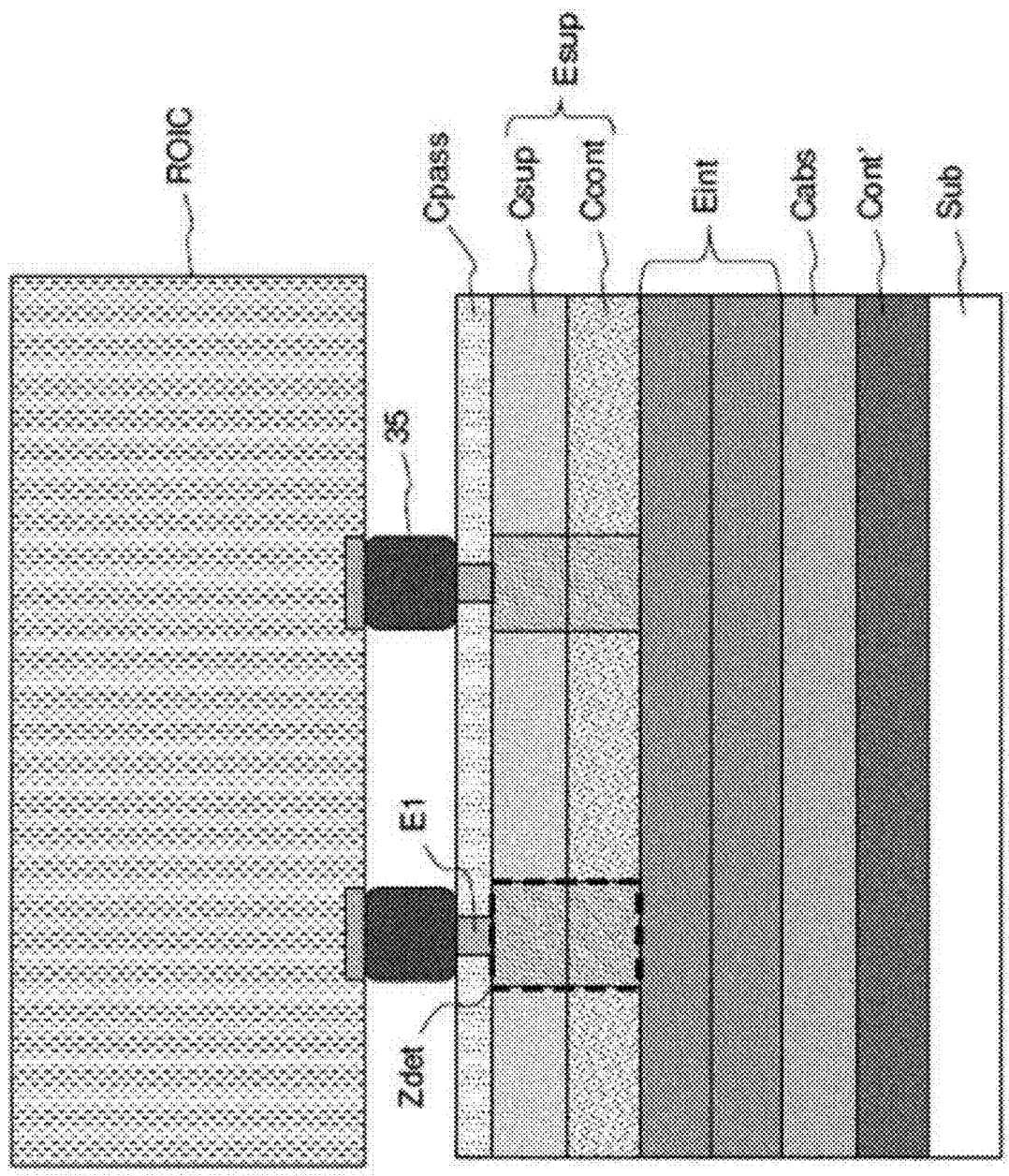
FIG. 14 illustrates a detector according to the invention produced by the first variant of the method according to the invention.

According to a first variant, which is illustrated in FIG. 13, the method 30 furthermore comprises, after the metallization step 400, a step 500 of connecting a reading circuit ROIC to said stack via the first electrode E1. This connection step is conventionally referred to as hybridization. FIG. 14 illustrates the radiation detector produced in this way. The hybridization is carried out, for example, with balls of indium 35 in contact with E1. The other electrode E2 (not represented) is for example produced using a metallized hole ("via hole") which passes through the entire stack as far as Ccont', so as to constitute an electrode common to all the pixels.

Figure 15:
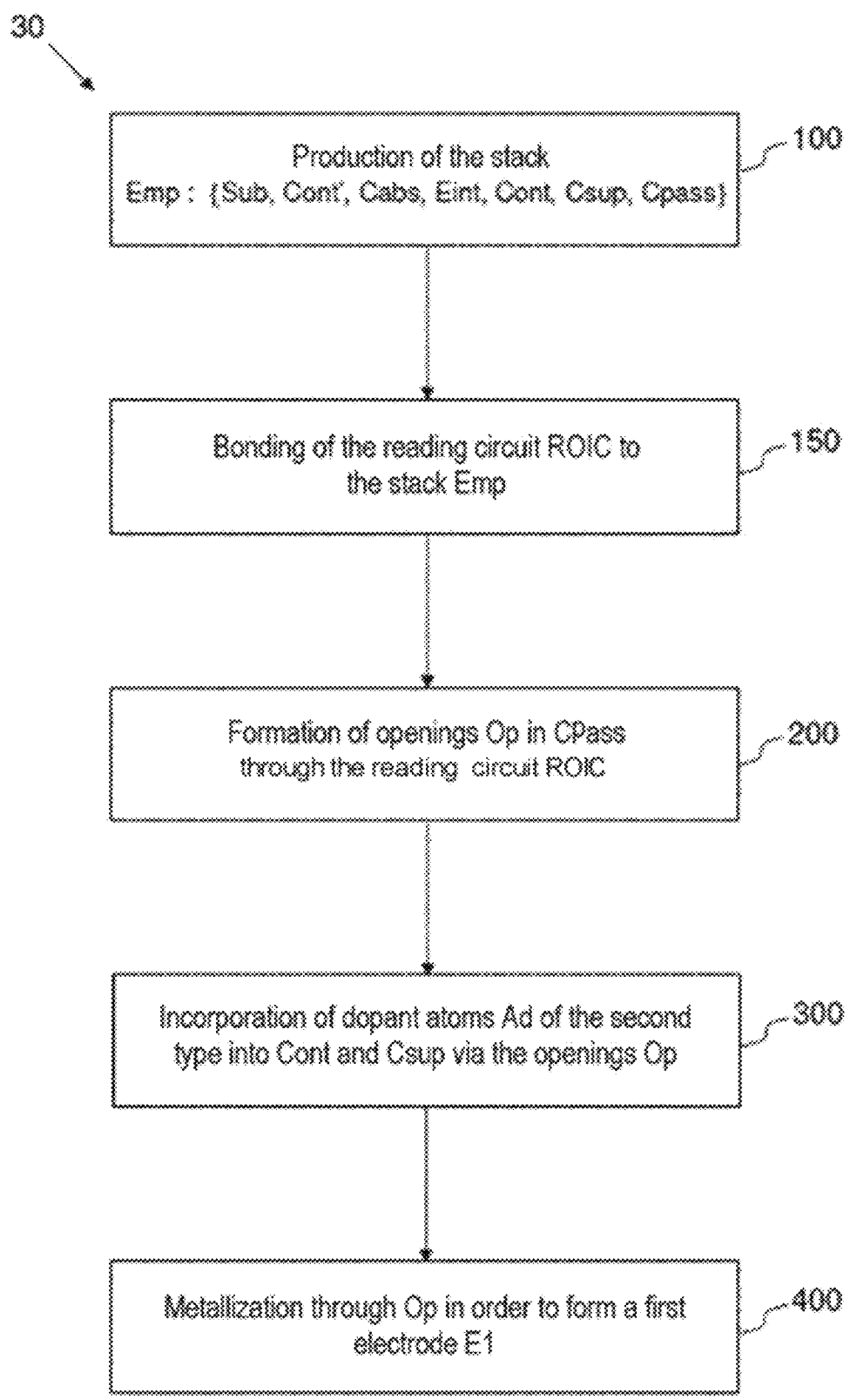
FIG. 15 illustrates a second variant of the method for producing a radiation detector according to the invention.
Figure 16:
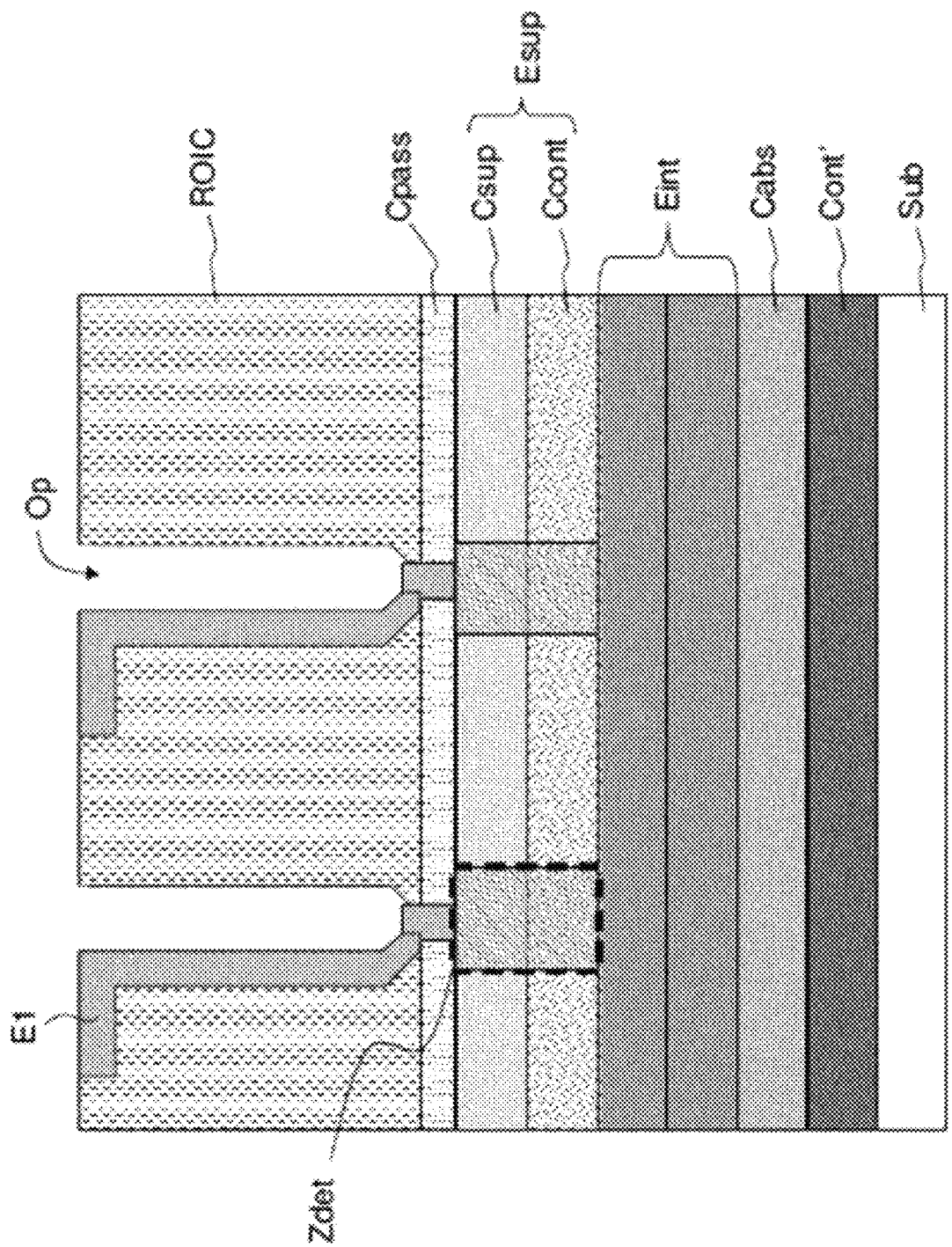
FIG. 16 illustrates a detector according to the invention produced by the second variant of the method according to the invention.

According to a second variant, which is illustrated in FIG. 15, the method 30 furthermore comprises, after the step of producing the stack, a step 150 of bonding a reading circuit ROIC to said stack. The bonding is typically carried out by direct dielectric/dielectric bonding. The step 200 of forming the openings Op is then carried out through the reading circuit ROIC, and the metallization for the production of the first electrode E1 also passes through the ROIC circuit. FIG. 16 illustrates the radiation detector produced in this way. A method describing pixel formation by diffusion and bonding between a stack and a ROIC circuit in order to produce a detector, using holes through silicon referred to as TSVs ("Through Silicon Vias"), is described, for example, in document FR1601066.

The invention claimed is:

1. A radiation detector comprising a stack (Emp) of layers along a direction Z, said stack comprising:
    an absorbent layer (Cabs) configured to absorb the radiation and made from a first semiconductor material (M1) having a first gap (G1) and doping of a first type (t1),
    a first contact layer (Ccont) made from a second material (M2) having a second gap (G2) strictly greater than the first gap (G1),
    an assembly consisting of at least one intermediate layer (Cint, Cinti), referred to as an intermediate assembly (Eint), arranged between the absorbent layer and the first contact layer, each intermediate layer (Cint, Cinti) being made from an intermediate semiconductor material (Mint, Minti) having an intermediate gap (Gint, Ginti) greater than or equal to the first gap (G1),
    an upper layer (Csup) arranged on the first contact layer (Ccont) on the opposite side from said intermediate assembly, made from a third semiconductor material (M3) having a third gap (G3) strictly greater than all the other gaps of the stack,
    the first contact layer and the upper layer having a plurality of detection zones (Zdet) and separation zones (Zsep), a separation zone separating one detection zone from another detection zone, each detection zone being surrounded by a separation zone in a plane perpendicular to Z, a detection zone corresponding to a pixel of said detector, the second (M2) and third (M3) materials being configured to have doping of a second type (t2) in the detection zones (Zdet) and doping of the first type (t1) in the separation zones (Zsep),
    when the first doping type is n, a valence band (BVabs) of the first material (M1) is strictly less than a valence band (BVcont) of the second material (M2) in the detection zones, and the valence band or bands (BVinti) of the intermediate material or materials lie between the valence band (BVabs) of the first material and the valence band (BVcont) of the second material in the detection zones, and are configured to vary monotonically increasingly in the direction from the absorbent layer (Cabs) toward the first contact layer (Ccont),
    when the first doping type is p, a conduction band (BCabs) of the first material (M1) is strictly greater than a conduction band (BCcont) of the second material in the detection zones, and the conduction band or bands (BCinti) of the intermediate material or materials (Mint) lie between the conduction band (BCabs) of the first material and the conduction band (BCcont) of the second material in the detection zones, and are configured to vary monotonically decreasingly in the direction from the absorbent layer (Cabs) toward the first contact layer (Ccont),
    a passivation layer (Cpass) made from a dielectric material (Mdiel), arranged on the upper layer (Csup) and having openings (Op) at the level of the detection zones of the upper layer,
    the semiconductor layers of the stack being compounds based on elements of groups IIIA and VA of the periodic table of the elements, the second material (M2) comprising the VA element antimony (Sb) and the third material (M3) not comprising the VA element antimony (Sb).

2. The detector as claimed in claim 1, wherein when the first doping type is n, the valence band(s) (BVint) of the intermediate material or materials (Mint, Minti) are less than the conduction band (BCcont) of the second material (M2),
    and wherein when the first doping type is p, the conduction band(s) of the intermediate material or materials are greater than the valence band (BVcont) of the second material.

3. The radiation detector as claimed in claim 1, wherein at the interface between the upper layer and the contact layer in the detection zones,
    when the first doping type is n, the valence band (BVsup) of the third material lies below the valence band (BVcont) of the second material and the conduction band (BCsup) of the third material lies above the conduction band (BCcont) of the second material,
    and when the first doping type is p, the conduction band of the third material (BCsup) lies above the conduction band (BCcont) of the second material and the valence band (BVsup) of the third material lies below the valence band (BVcont) of the second material.

4. The radiation detector as claimed in claim 1, wherein the third material (M3) is of the type III-As.

5. The radiation detector as claimed in claim 1, wherein the second material (M2) is GaSb and the third material (M3) is InGaAs.

6. The detector as claimed in claim 5, wherein the percentage of indium of the third material is less than 50%.

7. The radiation detector as claimed in claim 1, furthermore comprising:
    a second contact layer (Ccont') arranged below the absorbent layer and on the opposite side from the intermediate layer, made from a fourth semiconductor material (M4) having a fourth gap (G4) strictly greater than the first gap (G1) and doping of the first type,
    a substrate (Sub) on which the second contact layer (Ccont') is deposited.

8. The radiation detector as claimed in claim 1, wherein the doping of the second type of the detection zones is obtained by incorporation of dopant atoms (Ad) into the contact layer and the upper layer, which is carried out after the growth of said contact layer and upper layer, and via said openings.

9. The radiation detector as claimed in claim 8, wherein the upper layer (Csup) and the first contact layer (Ccont) have, in the detection zones and over their entire respective thickness, a quantity of dopant atoms (Ad) greater than $10^{17}$ atoms/cm$^3$.

10. A method for producing a radiation detector, comprising:
- a step of producing a stack (Emp) of layers along a direction Z on a substrate (Sub), comprising:
- an absorbent layer (Cabs) configured to absorb the radiation and made from a first semiconductor material (M1) having a first gap (G1) and doping of a first type (t1),
- a first contact layer (Ccont) made from a second material (M2) having a second gap (G2) strictly greater than the first gap (G1),
- a second contact layer (Ccont') made from a fourth semiconductor material (M4) having a fourth gap (G4) strictly greater than the first gap (G1) and doping of the first type, arranged between the substrate and the absorbent layer,
- an assembly consisting of at least one intermediate layer (Cint, Cinti), referred to as an intermediate assembly (Eint), arranged between the absorbent layer and the first contact layer, each intermediate layer (Cint, Cinti) being made from an intermediate semiconductor material (Mint, Minti) having an intermediate gap (Gint, Ginti) greater than the first gap (G1),
- an upper layer (Csup) arranged on the first contact layer (Ccont) on the opposite side from said intermediate assembly, made from a third semiconductor material (M3) having a third gap (G3) strictly greater than all the other gaps of the stack,
- a passivation layer (Cpass) made from a dielectric material (Mdiel), arranged on the upper layer (Csup),
- the semiconductor layers of the stack being compounds based on elements of groups IIIA and VA of the periodic table of the elements, the second material (M2) comprising the VA element antimony (Sb) and the third material (M3) not comprising the VA element antimony (Sb),
- the second and third materials being configured to have doping of the first type,
- when the first doping type is n, a valence band (BVabs) of the first material (M1) is strictly less than a valence band (BVcont) of the second material (M2) in the detection zones, when the first doping type is p, a conduction band (BCabs) of the first material (M1) is strictly greater than the conduction band (BCcont) of the second material in the detection zones,
- a step of forming openings (Op) in the passivation layer (Cpass),
- a step of incorporating dopant atoms (Ad) into the first contact layer (Ccont) and into the upper layer (Csup) via the openings (Op), so as to form detection zones (Zdet) having a second doping type, the detection zones being separated by separation zones (Zsep) separating one detection zone from another detection zone, each detection zone being surrounded by a separation zone in a plane perpendicular to Z, a detection zone corresponding to a pixel of said detector, the second (M2) and third (M3) materials then having doping of the second type (t2) in the detection zones (Zdet) and doping of the first type (t1) in the separation zones (Zsep),
- when the first doping type is n, the valence band or bands (BVinti) of the intermediate material or materials lying between the valence band (BVabs) of the first material and the valence band (BVcont) of the second material in the detection zones, and being configured to vary monotonically increasingly in the direction from the absorbent layer (Cabs) toward the first contact layer (Ccont),
- when the first doping type is p, the conduction band or bands (BCinti) of the intermediate material or materials (Mint) lying between the conduction band (BCabs) of the first material and the conduction band (BCcont) of the second material in the detection zones, and being configured to vary monotonically decreasingly in the direction from the absorbent layer (Cabs) toward the first contact layer (Ccont),
- a step of metallization through the openings (Op) in order to form a first electrode (E1).

11. The method as claimed in claim 10, wherein the step of incorporating dopant atoms is carried out by diffusion.

12. The method as claimed in claim 10, wherein the first doping type is n and the dopant atom incorporated is zinc.

13. The method as claimed in claim 10, furthermore comprising, after the metallization step, a step of connecting a reading circuit (ROIC) to said stack via said first electrode (E1).

14. The method as claimed in claim 10, furthermore comprising, after the step of producing the stack, a step of bonding a reading circuit (ROIC) to said stack, the step of forming the openings then being carried out through the reading circuit.

* * * * *